United States Patent
Shimizu

(10) Patent No.: US 9,425,038 B2
(45) Date of Patent: Aug. 23, 2016

(54) METHOD AND APPARATUS FOR FORMING SILICON OXYCARBONITRIDE FILM, SILICON OXYCARBIDE FILM AND SILICON OXYNITRIDE FILM

(71) Applicant: TOKYO ELECTRON LIMITED, Tokyo (JP)

(72) Inventor: Akira Shimizu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/525,250

(22) Filed: Oct. 28, 2014

(65) Prior Publication Data

US 2015/0118865 A1 Apr. 30, 2015

(30) Foreign Application Priority Data

Oct. 29, 2013 (JP) .................. 2013-224618

(51) Int. Cl.
| | |
|---|---|
| H01L 21/31 | (2006.01) |
| H01L 21/02 | (2006.01) |
| C23C 16/30 | (2006.01) |
| C23C 16/40 | (2006.01) |
| C23C 16/455 | (2006.01) |

(52) U.S. Cl.
CPC ............ *H01L 21/0214* (2013.01); *C23C 16/30* (2013.01); *C23C 16/401* (2013.01); *C23C 16/45527* (2013.01); *C23C 16/45531* (2013.01); *H01L 21/0228* (2013.01); *H01L 21/02126* (2013.01); *H01L 21/02216* (2013.01); *H01L 21/02219* (2013.01)

(58) Field of Classification Search
CPC ................... H01L 21/0214; H01L 21/02214; H01L 21/0228
USPC ................................... 438/787–791
See application file for complete search history.

(56) References Cited

U.S. PATENT DOCUMENTS

2014/0342573 A1* 11/2014 Hirose et al. ............ 438/761
2014/0356549 A1* 12/2014 Varadarajan ............ 427/568

FOREIGN PATENT DOCUMENTS

| JP | 2010-268007 A | 11/2010 |
|---|---|---|
| JP | 2011-061218 A | 3/2011 |
| JP | 2011-125395 A | 6/2011 |
| JP | 2013-135176 A | 7/2013 |
| JP | 2013-206989 A | 10/2013 |
| WO | 2011/125395 A1 | 10/2011 |

* cited by examiner

*Primary Examiner* — H Tsai
(74) *Attorney, Agent, or Firm* — Nath, Goldberg & Meyer; Jerald L. Meyer

(57) ABSTRACT

A method for forming a silicon oxycarbonitride film includes supplying a gas containing a silicon precursor having an oxygen-containing group onto a process surface of a workpiece, supplying a gas containing a carbon precursor onto the process surface, and supplying a nitriding gas onto the process surface subjected to the supplying a gas containing a silicon precursor and the supplying a gas containing a carbon precursor. The silicon oxycarbonitride film is formed on the process surface by the supplying the gas containing the silicon precursor, the supplying gas containing the carbon precursor and the supplying a nitriding gas without performing an oxidation process.

7 Claims, 35 Drawing Sheets

(DEAMEOS)

(DEAEEOS)

(DiPAEEOS)

(DiPADEEOS)

US 9,425,038 B2

METHOD AND APPARATUS FOR FORMING SILICON OXYCARBONITRIDE FILM, SILICON OXYCARBIDE FILM AND SILICON OXYNITRIDE FILM

CROSS-REFERENCE TO RELATED APPLICATION

This application claims the benefit of Japanese Patent Application No. 2013-224618, filed on Oct. 29, 2013, in the Japan Patent Office, the disclosure of which is incorporated herein in its entirety by reference.

TECHNICAL FIELD

The present disclosure relates to a method and apparatus for forming a silicon oxycarbonitride film, a silicon oxycarbide film and a silicon oxynitride film.

BACKGROUND

With the miniaturization of semiconductor integrated circuit devices, for example, in order to reduce parasitic capacitance between gates of transistors, there is a need for a low-k spacer formed by a low-k film having a lower dielectric constant than $SiO_2$. Examples of films used for the low-k spacer may include a silicon oxycarbonitride (SiOCN) film and a silicon oxycarbide (SiOC) film. There have been proposed conventional methods for forming the SiOCN film or the SiOC film using a CVD method or an ALD method.

In the proposed methods, when the SiOCN film or the SiOC film is formed using the CVD method or the ALD method, a silicon film containing carbon and nitrogen is first formed and the SiOCN film or the SiOC film is then formed by oxidizing the carbon and nitrogen-containing silicon film. Reactants (oxygen-containing active species) such as $O_2$, $O_3$, $N_2O$, $O_2$ plasma, O radicals and so on are used for this oxidation.

However, the oxidizing power of such reactants (oxygen-containing active species) used for the oxidation is too strong. As a result, it may oxidize bonds such as Si—C, Si—N and so on. This makes it difficult to form an SiOCN film having a high concentration of carbon and nitrogen and an SiOC film having a high concentration of carbon.

For example, the percentages of carbon and nitrogen contained in a SiOCN film formed using the oxygen-containing active species result in low levels of both, e.g., below 10%. Similarly, the percentage of carbon contained in the SiOC film formed using these oxygen-containing active species is also low, e.g., below 10%.

SUMMARY

Various embodiments of the present disclosure provide a method and apparatus for forming a silicon oxycarbonitride film, a silicon oxycarbide film and a silicon oxynitride film without using oxygen-containing active species, and for forming a silicon oxycarbonitride film, a silicon oxycarbide film and a silicon oxynitride film having a high concentration of carbon and/or nitrogen.

According to a first aspect of the present disclosure, there is provided a method for forming a silicon oxycarbonitride film includes supplying a gas containing a silicon precursor having an oxygen-containing group onto a process surface of a workpiece, supplying a gas containing a carbon precursor onto the process surface, and supplying a nitriding gas onto the process surface subjected to the supplying a gas containing a silicon precursor and the supplying a gas containing a carbon precursor. The silicon oxycarbonitride film is formed on the process surface by the supplying the gas containing the silicon precursor, the supplying gas containing the carbon precursor and the supplying a nitriding gas without performing an oxidation process.

According to a second aspect of the present disclosure, there is provided a method for forming a silicon oxycarbide film includes supplying a gas containing a silicon precursor having an oxygen-containing group onto a process surface of a workpiece, and supplying a gas containing a carbon precursor onto the process surface, wherein a silicon oxycarbide film is formed on the process surface by the supplying the gas containing the silicon precursor and the supplying the gas containing the carbon precursor without performing an oxidation process.

According to a third aspect of the present disclosure, there is provided a method for forming a silicon oxynitride film includes supplying a gas containing a silicon precursor having an oxygen-containing group onto a process surface of a workpiece, and supplying a nitriding gas onto the process surface subjected to the supplying a gas containing a silicon precursor, wherein a silicon oxynitride film is formed on the process surface by the supplying the gas containing the silicon precursor and the supplying the nitriding gas without performing an oxidation process.

According to a fourth aspect of the present disclosure, there is provided an apparatus for forming a silicon oxycarbonitride film on a workpiece includes a process chamber in which the workpiece having a surface on which the silicon oxycarbonitride film is formed is accommodated, a process gas supply mechanism configured to supply process gases into the process chamber, and a controller configured to control the process gas supply mechanism, wherein the controller controls the process gas supply mechanism to perform the above mentioned method for forming a silicon oxycarbonitride film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
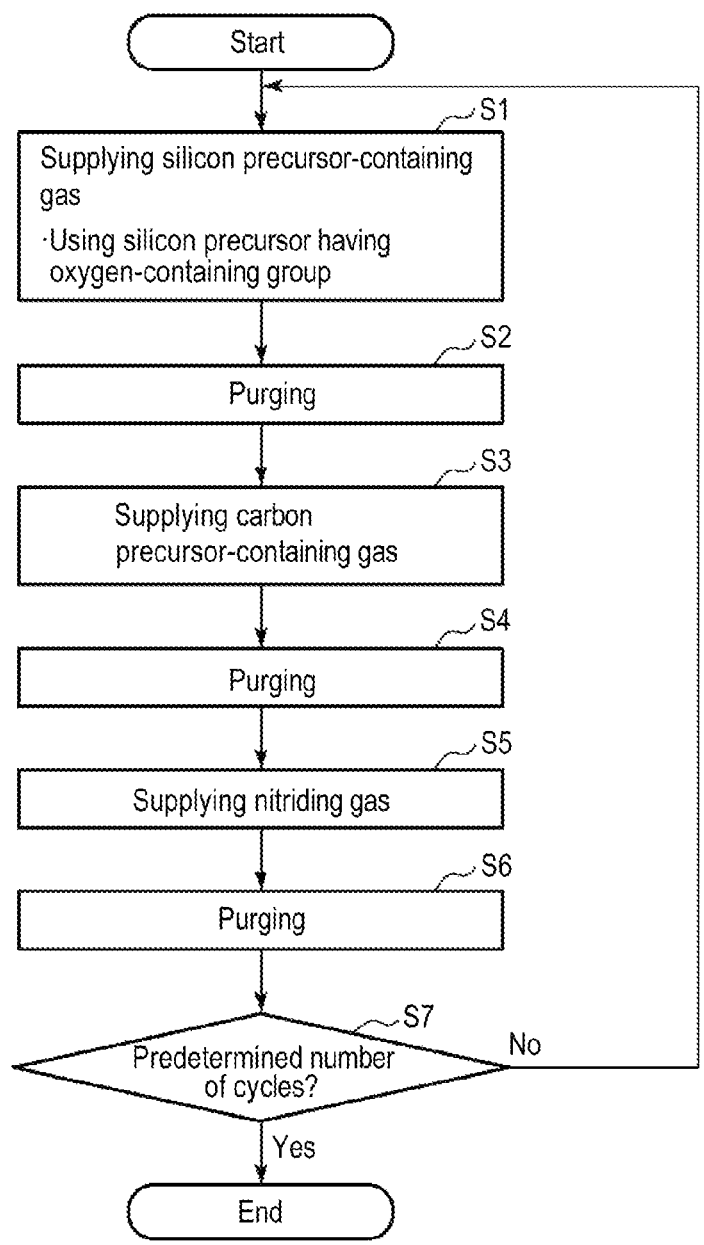
FIG. 1 is a flow chart showing one example of a sequence of a method for forming a silicon oxycarbonitride film according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Throughout the drawings, the elements are denoted by the same reference numerals.

<First Embodiment: Silicon oxycarbonitride (SiOCN) film forming method>

Figure 2:
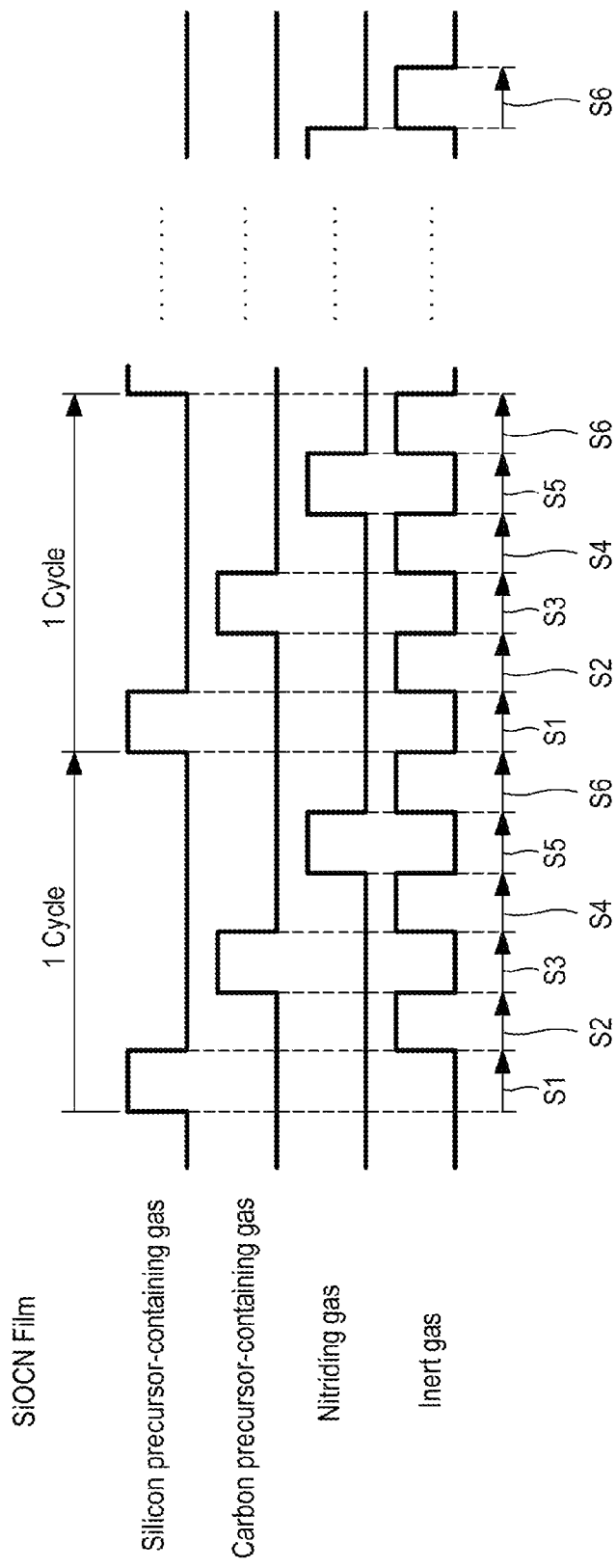
FIG. 2 is a timing diagram showing an example of the timing of supplying process gases.
Figure 3A:
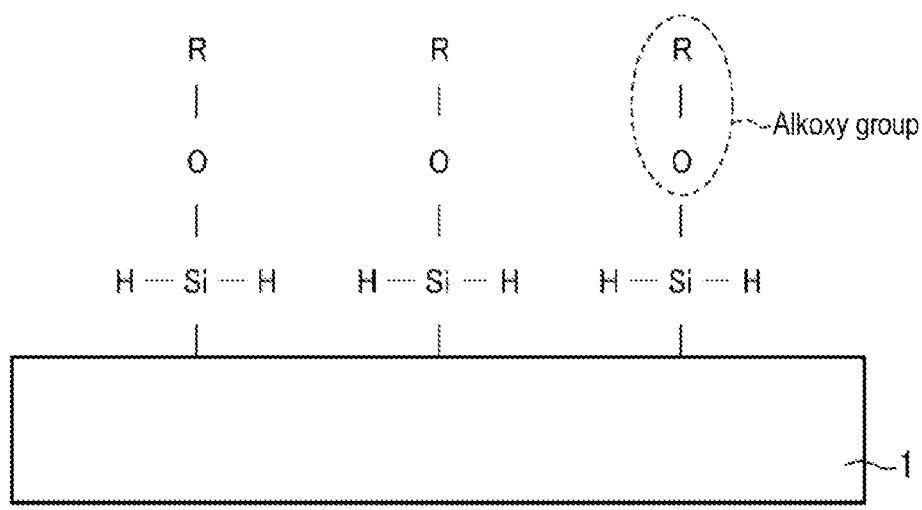
FIGS. 3A to 3C are schematic views showing a state of a workpiece in a sequence of a film forming process.
Figure 3B:
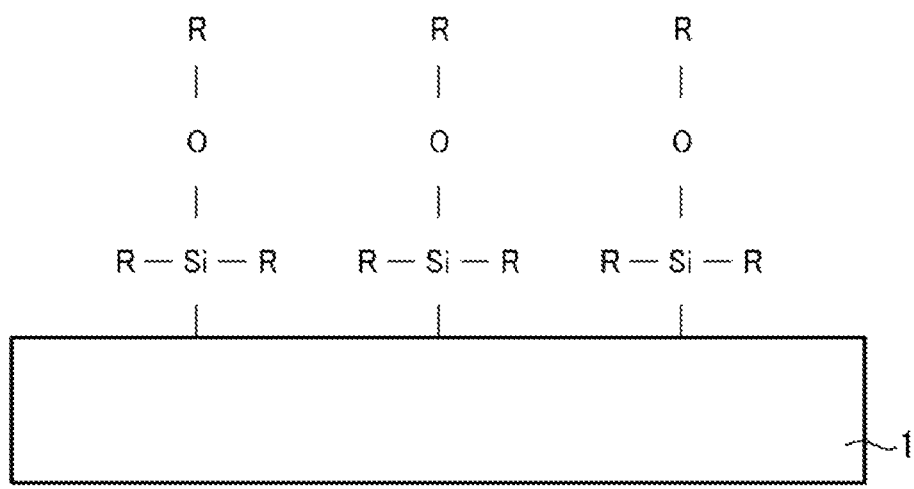
Figure 3C:
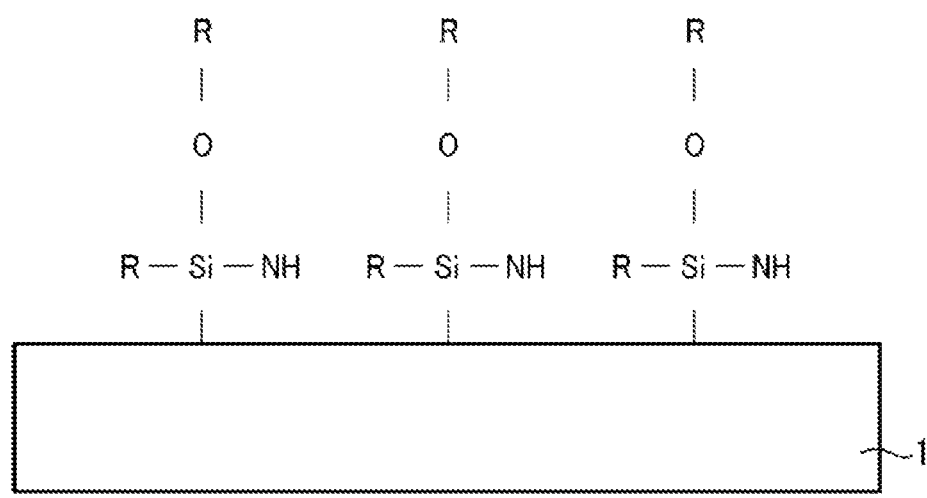

FIG. 1 is a flow chart showing one example of a sequence of a method for forming a silicon oxycarbonitride film according to a first embodiment of the present disclosure, FIG. 2 is a timing diagram showing an example of the timing of supplying process gases to the interior of a process chamber of a film forming apparatus, and FIGS. 3A to 3C are schematic views showing a state of a workpiece in a sequence of a film forming process.

First, a workpiece is loaded into a process chamber of a film forming apparatus for performing a film forming process. Next, as shown in Step S1 in FIGS. 1 and 2, a gas containing a silicon precursor having a group containing oxygen is supplied onto a surface (to be processed) of the workpiece. One example of the workpiece may be a silicon wafer 1 as shown in FIG. 3A. Thus, silicon (Si) bonded with oxygen (O) is adsorbed or deposited on the surface of the silicon wafer 1. The process surface of the silicon wafer 1 (i.e., a base on which a silicon oxycarbonitride film is to be formed) may be either a conductor (such as a silicon or the like) or an insulator (such as a silicon oxide film or the like).

In the first embodiment, a silicon precursor having a group containing oxygen is used. One example of the silicon precursor having a group containing oxygen is diethylaminodimethylethoxysilane (DEADMEOS). DEADMEOS has an alkoxy group (—OR) as an oxygen-containing group. The alkoxy group of DEADMEOS is an ethoxy group (—OC$_2$H$_5$).

One example of processing conditions of Step S1 is as follows:

Flow rate of DEADMEOS: 300 sccm
Process time: 1 min
Process temperature: 400 degrees C.
Process pressure: 133 Pa (1 Torr).
In the specification, 1 Ton is defined as 133 Pa Next, as shown in Step S2 in FIGS. 1 and 2, the interior of the process chamber is purged with an inert gas. One example of the inert gas is argon (Ar) gas.

Next, as shown in Step S3 in FIGS. 1 and 2, a gas containing a carbon precursor is supplied onto the surface of the silicon wafer 1 onto which the silicon precursor was supplied. One example of the carbon precursor is hexane (C$_6$H$_{14}$). Thus, as shown in FIG. 3B, on the process surface of the silicon wafer 1, some of substituents bonded to Si are substituted with hydrocarbon groups (R). An example in which hydrogen (H) as a substituent bonded to Si is substituted with a hydrocarbon group (R) is shown in FIGS. 3A and 3B.

Thus, as the substituents bonded to Si are substituted with the hydrocarbon groups (R), carbon (C) and oxygen (O) are bonded to the silicon adsorbed or deposited on the surface of the silicon wafer 1.

One example of the processing conditions of Step S3 is as follows:

Flow rate of hexane: 200 sccm
Process time: 1 min
Process temperature: 400 degrees C.
Process pressure: 133 Pa (1 Torr)

Next, as shown in Step S4 in FIGS. 1 and 2, the interior of the process chamber is purged with an inert gas.

Next, as shown in Step S5 in FIGS. 1 and 2, a nitriding gas is supplied onto the process surface of the silicon wafer 1 onto which the carbon precursor was supplied. One example of a nitriding gas is ammonia (NH$_3$). Thus, as shown in FIG. 3C, on the process surface of the silicon wafer 1, some of hydrocarbon groups (R) bonded to Si are substituted with amino groups (NH).

Thus, as some of the hydrocarbon groups (R) that were bonded to Si is substituted with the amino groups (NH), the element nitrogen (N), in addition to oxygen (O) and carbon (C), is bonded to the silicon adsorbed or deposited on the process surface of the silicon wafer 1.

One example of processing conditions of Step S5 is as follows:

Flow rate of NH$_3$: 1000 sccm
Process time: 3 min
Process temperature: 400 degrees C.
Process pressure: 133 Pa (1 Torr)

Next, as shown in Step S6 in FIGS. 1 and 2, the interior of the process chamber is purged with an inert gas. Steps S1 to S6 constitute one cycle.

Next, as shown in Step S7 in FIG. 1, it is determined whether the thickness of the silicon oxycarbonitride film reaches a designed value. To this end, for example, the number of cycles required to reach the designed film thickness value, i.e., a predetermined number of cycles, is set in advance and a determination of whether or not the number of cycles reaches the predetermined number of cycles is conducted. If the number of cycles does not reach the predetermined number of cycles ("NO") yet, the process returns to Step S1 and repeats Steps S1 to S6. If the number of cycles reaches the predetermined number of cycles ("YES"), the forming of the silicon oxycarbonitride film is complete.

In the silicon oxycarbonitride film forming method according to the first embodiment, the silicon precursor having the oxygen-containing groups is used. This allows an oxygen-containing silicon film to be formed on the process surface (Step S1). Thereafter, carbon (Step S3) and nitrogen (Step S5) are contained in the oxygen-containing silicon film. Thus, without an oxidation process of oxidizing the process surface of the silicon wafer 1, the silicon oxycarbonitride (SiOCN) film can be formed on the process surface of the silicon wafer 1.

Since the SiOCN film can be formed without an oxidation process in this manner, it is possible to remarkably suppress bonds such as Si—C and Si—N from being oxidized, when compared to a case where the SiOCN film is formed with the oxidation process. This allows an SiOCN film having a high concentration of carbon and nitrogen to be formed without using oxygen-containing active species ($O_2$, $O_3$, $N_2O$, $O_2$ plasma, O radicals and so on).

According to the silicon oxycarbonitride film forming method of the first embodiment, it is possible to obtain an SiOCN film containing carbon and nitrogen at ratios of 10% or more, respectively, which is difficult to be achieved in an SiOCN film formed through an oxidation process.

<Example of Silicon Precursor Having Oxygen-containing Groups>

Figure 4A:
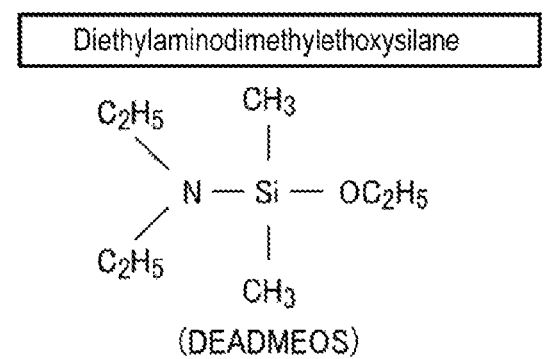
FIGS. 4A to 4S are views representing chemical formulas of a silicon precursor having an oxygen-containing group, respectively.
Figure 4B:
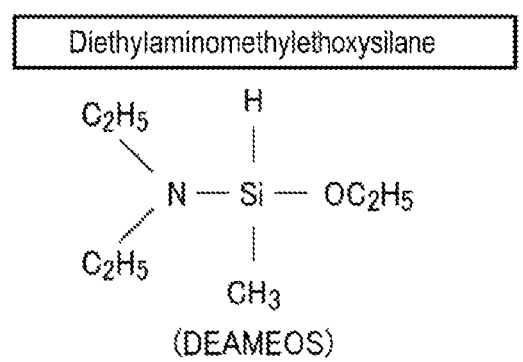
Figure 4C:
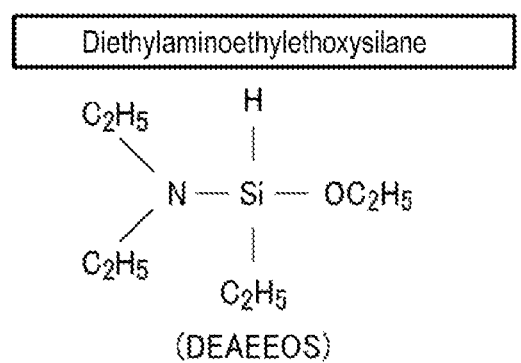
Figure 4D:
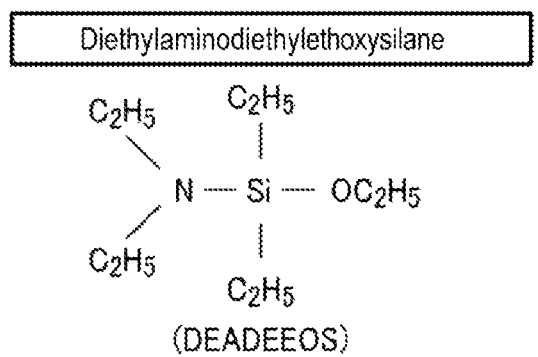
Figure 4E:
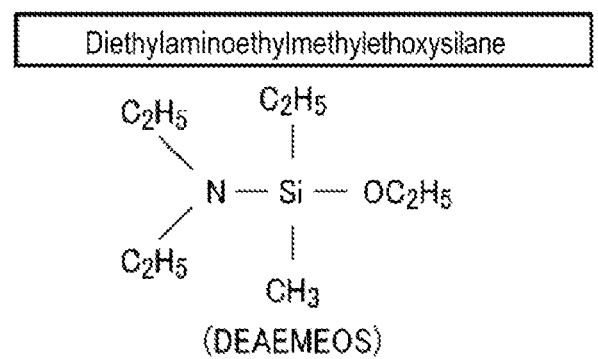
Figure 4F:
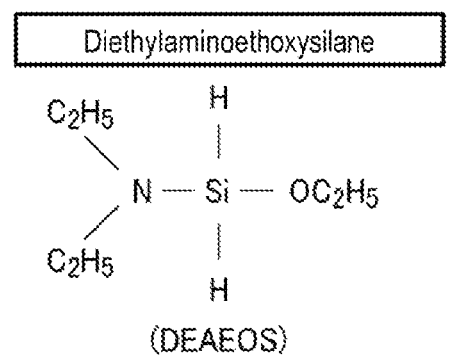
Figure 4G:
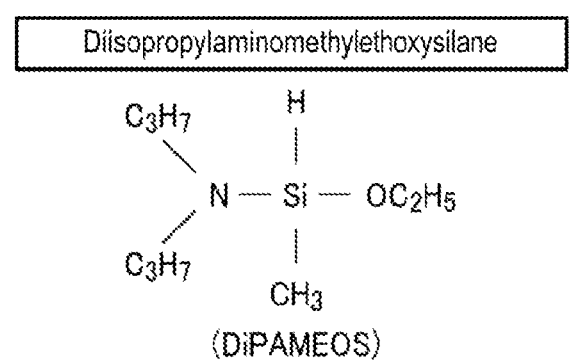
Figure 4H:
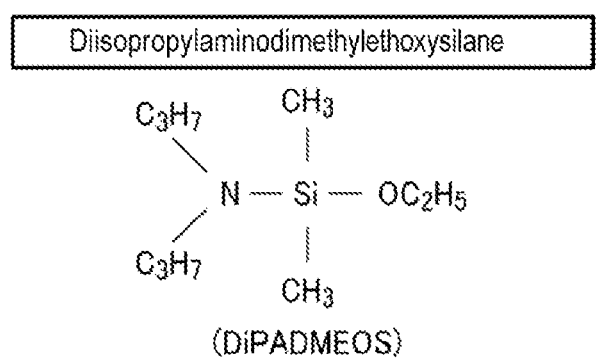
Figure 4I:
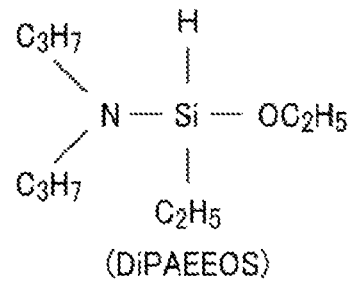
Figure 4J:
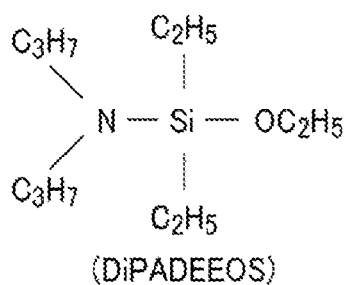
Figure 4K:
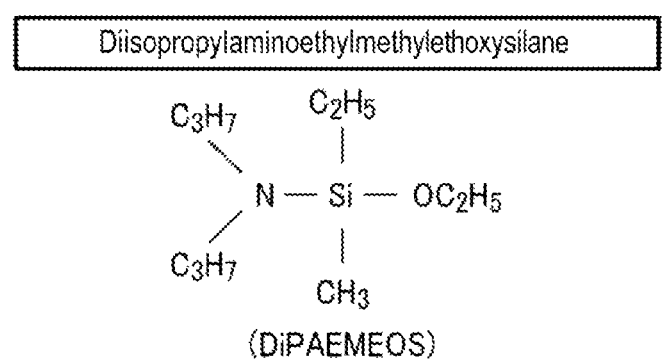
Figure 4L:
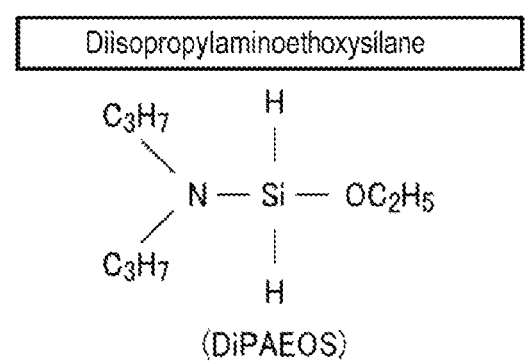
Figure 4M:
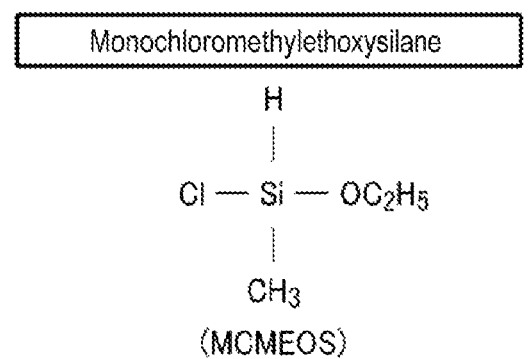
Figure 4N:
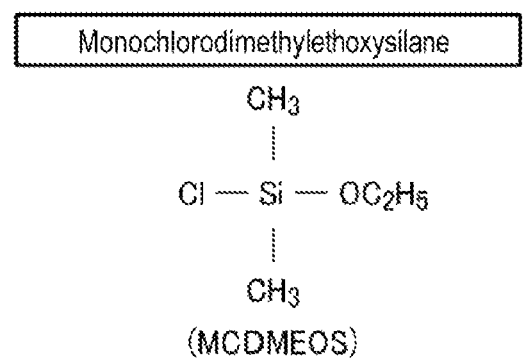
Figure 40:
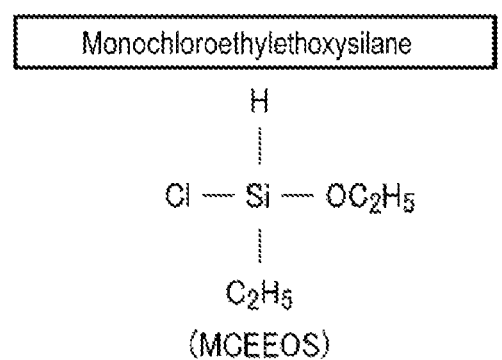
Figure 4P:
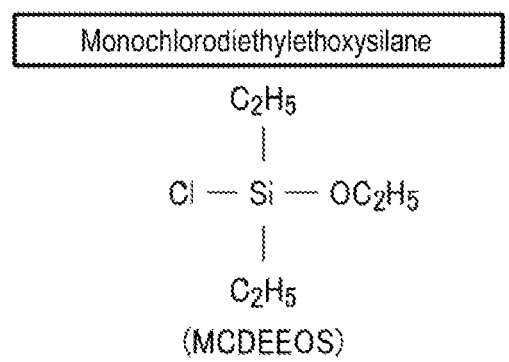
Figure 4Q:
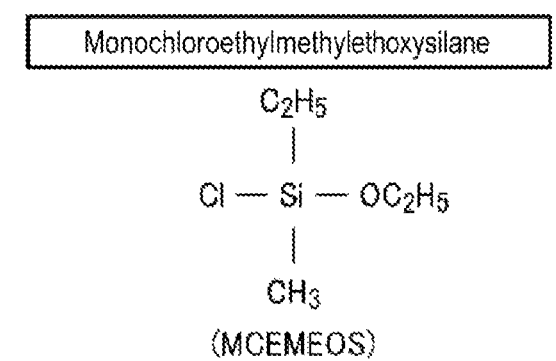
Figure 4R:
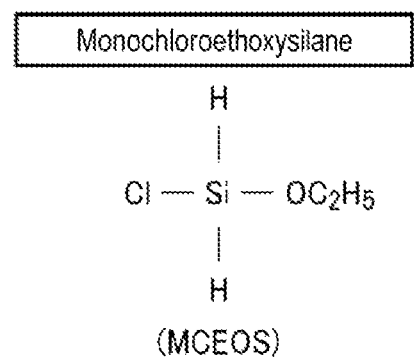
Figure 4S:
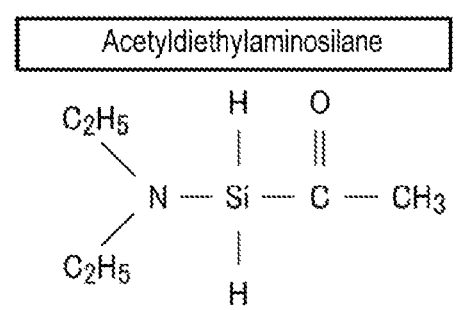

Next, an example of a silicon precursor having oxygen-containing groups will be described. FIGS. 4A to 4S are views showing chemical formulas of silicon precursors having oxygen-containing groups.

In the first embodiment, DEADMEOS is used as a silicon precursor having an oxygen-containing group. The chemical formula of DEADMEOS is shown in FIG. 4A.

As shown in FIG. 4A, DEADMEOS has an ethoxy group, an amino group and two methyl groups, which are bonded to four bonding sites of silicon, respectively. The oxygen-containing group is the ethoxy group.

Examples of the silicon precursor having the oxygen-containing group may include the followings, in addition to DEADMEOS:

Diethylaminomethylethoxysilane (DEAMEOS: FIG. 4B)
Diethylaminoethylethoxysilane (DEAEEOS: FIG. 4C)
Diethylaminodiethylethoxysilane (DEADEEOS: FIG. 4D)
Diethylaminoethylmethylethoxysilane (DEAEMEOS: FIG. 4E)
Diethylaminoethoxysilane (DEAEOS: FIG. 4F)
Diisopropylaminomethylethoxysilane (DiPAMEOS: FIG. 4G)
Diisopropylaminodimethylethoxysilane (DiPADMEOS: FIG. 4H)
Diisopropylaminoethylethoxysilane (DiPAEEOS: FIG. 4I)
Diisopropylaminodiethylethoxysilane (DEADEEOS: FIG. 4J)
Diisopropylaminoethylmethylethoxysilane (DiPAEMEOS: FIG. 4K)
Diisopropylaminoethoxysilane (DiPAEOS: FIG. 4L)
Monochloromethylethoxysilane (MCMEOS: FIG. 4M)
Monochlorodimethylethoxysilane (MCDMEOS: FIG. 4N)
Monochloroethylethoxysilane (MCEEOS: FIG. 4O)
Monochlorodiethylethoxysilane (MCDEEOS: FIG. 4P)
Monochloroethylmethylethoxysilane (MCEMEOS: FIG. 4Q)
Monochloroethoxysilane (MCEOS: FIG. 4R)

Each of these silicon precursors has an oxygen-containing group, e.g., an ethoxy group bonded to at least one bonding site of silicon. In addition, other bonding sites of silicon are bonded with at least one of hydrogen, a hydrocarbon group, an amino group and halogen. In the above example, halogen is chlorine (Cl).

<Example of Oxygen-containing Group>

Next, an example of the oxygen-containing group will be described.

An alkoxy group represented with —OR (R is a substituent) is illustrated in the first embodiment as a group containing oxygen bonded to silicon. One example of the alkoxy group is an ethoxy group represented by —$OC_2H_5$.

Figure 5:
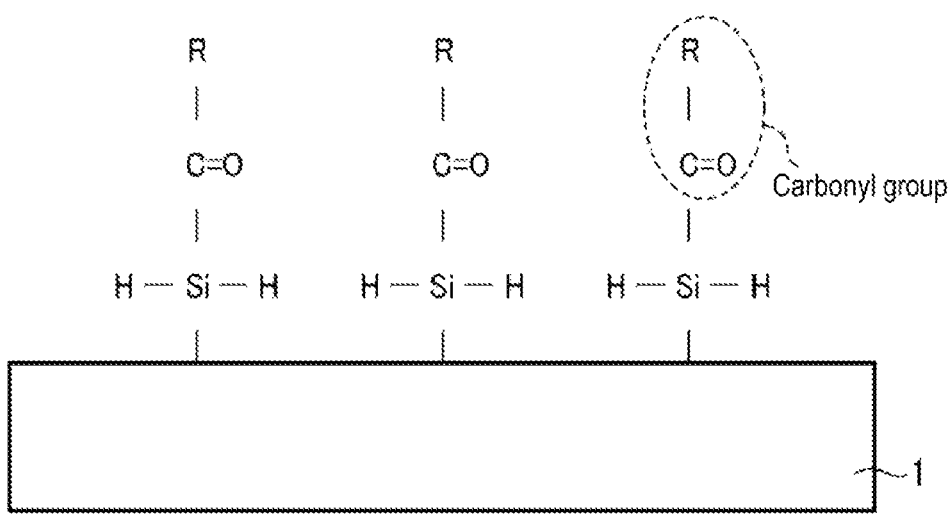
FIG. 5 is a view schematically showing a state where silicon bonded with a carbonyl group is adsorbed or deposited.

However, the oxygen-containing group is not limited to the alkoxy group. It may be, for example, a carbonyl group represented by —C(=O)R (R is a substituent). FIG. 5 schematically shows a state where silicon bonded with a carbonyl group is adsorbed or deposited on the process surface of the silicon wafer 1.

An example of the silicon precursor having the carbonyl group may be an acetyldiethylaminosilane shown in FIG. 4S. The acetyldiethylaminosilane has an acetyl group as the carbonyl group. As described above, the oxygen-containing group may be the carbonyl group.

<Second Embodiment: Silicon Oxycarbide (SiOC) Film Forming Method>

In the first embodiment, an example of forming the silicon oxycarbonitride (SiOCN) film was described. A second embodiment is described next relating to an example of forming a silicon oxycarbide (SiOC) film.

Figure 6:
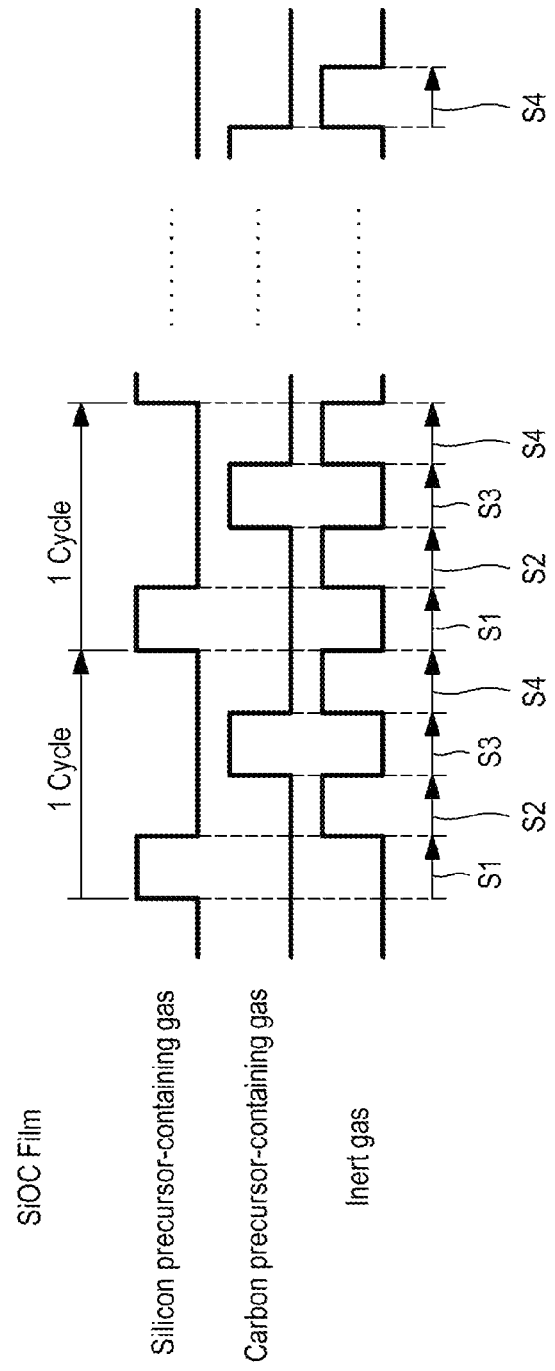
FIG. 6 is a timing diagram showing an example of the timing of supplying process gases in a silicon oxycarbide film forming method according to a second embodiment of the present disclosure.

FIG. 6 is a timing diagram showing an example of the timing of supplying process gases in the silicon oxycarbide film forming method according to the second embodiment of the present disclosure.

As shown in FIG. 6, for example, if Step S5 (nitrogen introduction) and Step S6 (purging) are omitted in the first embodiment described with reference to FIGS. 1 and 2 and a cycle composed of Steps S1 to S4 is repeated by a predetermined number of times, the silicon oxycarbide (SiOC) film can be formed.

For forming the SiOC film in this way, a silicon precursor having an oxygen-containing group is used. Thus, the SiOC film can be formed on the process surface of the silicon wafer 1 without an oxidation process of oxidizing the process surface of the silicon wafer 1.

Therefore, an SiOC film having a high concentration of carbon can be formed since it is possible to suppress bonds such as Si—C from being oxidized, as compared to a case where forming the SiOC film undergoes an oxidation process.

According to the silicon oxycarbide film forming method of the second embodiment, it is possible to obtain an SiOC film containing carbon at a ratio of 10% or more, which is difficult to be achieved in an SiOC film formed by way of an oxidation process.

<Third Embodiment: Silicon Oxynitride (SiON) Film Forming Method>

A third embodiment, described next, is an example of forming a silicon oxynitride (SiON) film.

Figure 7:
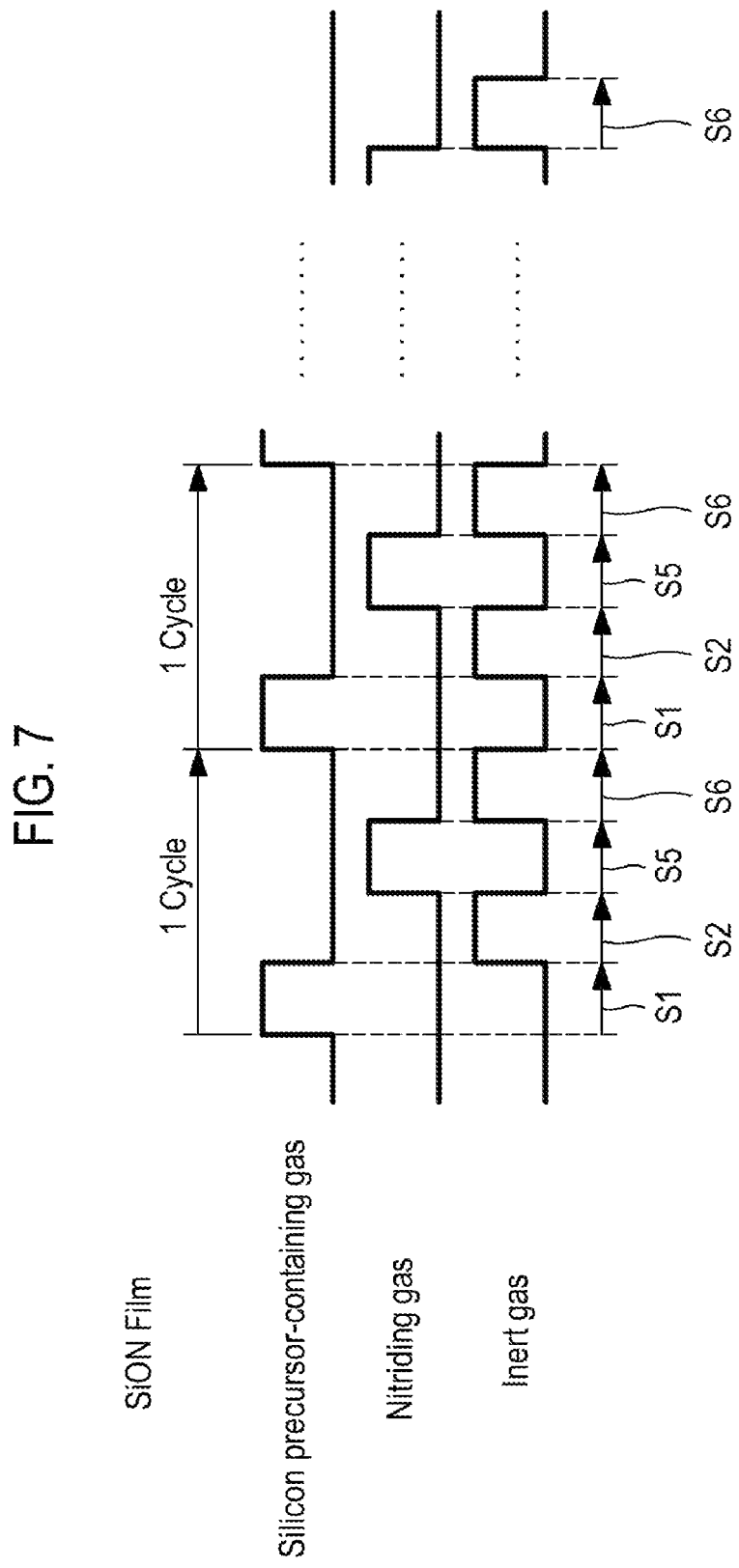
FIG. 7 is a timing diagram showing an example of the timing of supplying process gases in a silicon oxynitride film forming method according to a third embodiment of the present disclosure.

FIG. 7 is a timing diagram showing an example of supplying process gases in the silicon oxynitride film forming method according to the third embodiment of the present disclosure.

As shown in FIG. 7, for example, if Step S3 (carbon introduction) and Step S4 described with reference to FIGS. 1 and 2 are omitted and a cycle composed of Steps S1, S2, S5 and S6 is repeated a predetermined number of times, the silicon oxynitride (SiON) film can be formed.

For forming the formed SiON film in this way, a silicon precursor having an oxygen-containing group is used. Thus, the SiON film can be formed on the process surface of the silicon wafer 1 without an oxidation process of oxidizing the process surface of the silicon wafer 1.

Therefore, an SiON film having a high concentration nitrogen can be formed since it is possible to suppress bonds such as Si—N from being oxidized, as compared to a case where the SiON film is formed by way of an oxidation process.

According to the silicon oxynitride film forming method of the third embodiment, it is possible to obtain an SiON film containing nitrogen at a ratio of 10% or more, which is difficult to be achieved in an SiON film formed by way of an oxidation process.

<Fourth Embodiment: Modification of Timing of supply of Precursor>

A fourth embodiment relates to a modification of the timing of supplying a silicon precursor and a carbon precursor.

<Silicon Oxycarbonitride (SiOCN) Film Forming Method>

Figure 8:
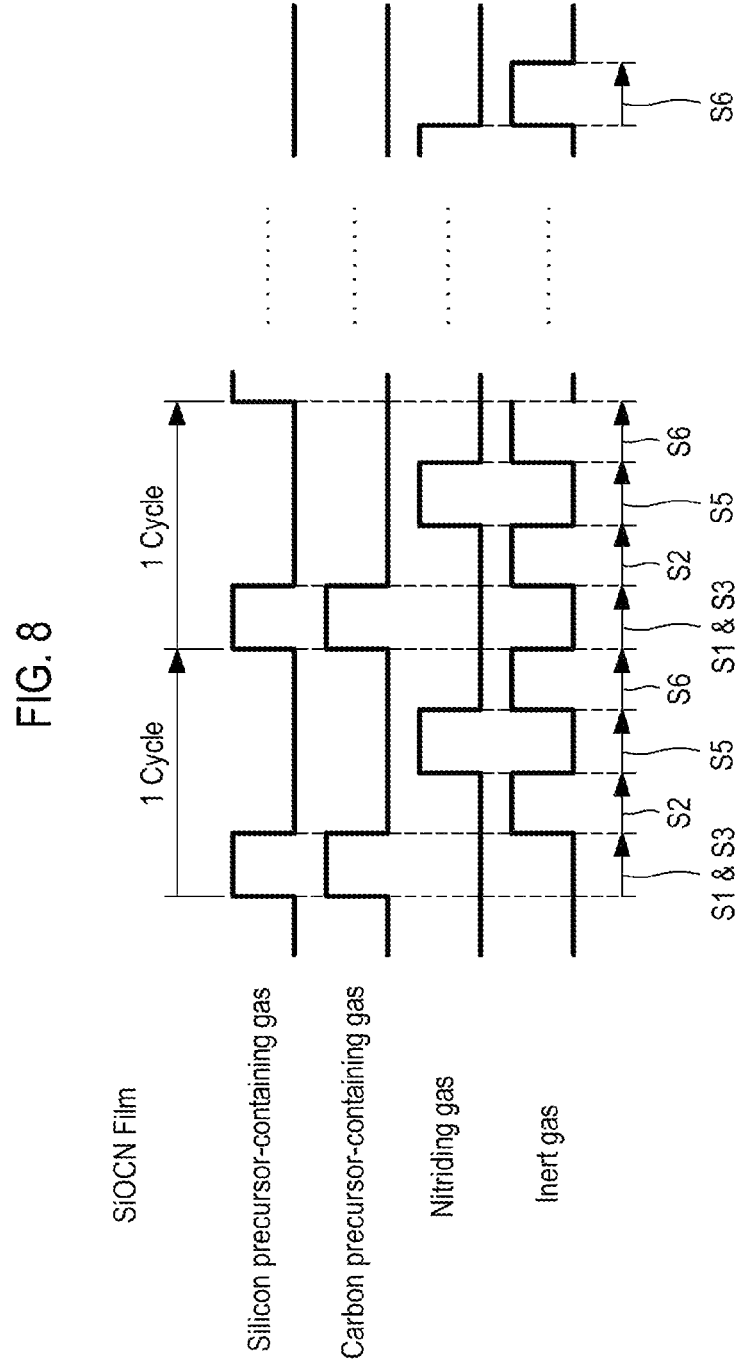
FIG. 8 is a timing diagram showing an example of the timing of supplying process gases in a silicon oxycarbonitride film forming method according to a fourth embodiment of the present disclosure.

FIG. 8 is a timing diagram showing an example of the timing of supplying process gases in the silicon oxycarbonitride film forming method according to the fourth embodiment of the present disclosure.

The silicon oxycarbonitride film forming method according to the fourth embodiment is different from the silicon oxycarbonitride film forming method according to the first embodiment. More specifically, while Step S3 is performed after Step S1 in the first embodiment, the performance of Step S3 occurs concurrently with Step S1 in the fourth embodiment such that the performance of Steps S3 and S1 overlap each other.

That is, Step S3 directed to carbon introduction is overlapped with Step S1 directed to the formation of the oxygen-containing silicon film. In this example, Step S3 and Step S1 may be performed concurrently.

In the fourth embodiment, a silicon precursor having an oxygen-containing group and a carbon precursor are simultaneously supplied onto the process surface of the silicon wafer 1. Thus, a silicon film containing both oxygen and carbon is formed on the process surface of the silicon wafer 1.

When a nitriding gas is supplied onto the process surface on which the silicon film containing oxygen and carbon is adsorbed or deposited, an SiOCN film containing oxygen, carbon and nitride can be formed.

Since the SiOCN film formed in this way is not subjected to an oxidation process, it is possible to obtain an SiOCN film containing high concentration of carbon and nitrogen, e.g., an SiOCN film containing carbon and nitrogen at ratios of 10% or more, respectively, as in the first embodiment.

In addition, as compared to the first embodiment where Step S3 and Step S1 are sequentially performed, since Step S3 and Step S1 are overlapped when performed, a time period for one cycle is saved in the fourth embodiment, which is beneficial to improving throughput.

<Silicon oxycarbide (SiOC) Film Forming Method>

Figure 9:
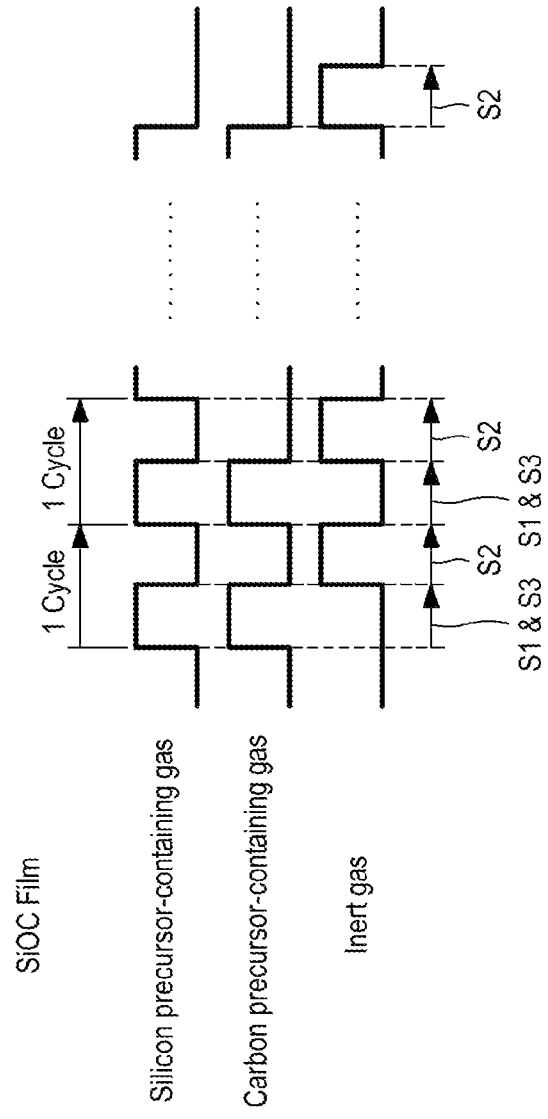
FIG. 9 is a timing diagram representing a first modification of supplying the process gases in the fourth embodiment of the present disclosure.

FIG. 9 is a timing diagram representing a first modification of supplying the process gases in the fourth embodiment of the present disclosure.

As shown in FIG. 9, if Step S5 (nitrogen introduction) and Step S6 (purging) shown in FIG. 7 are omitted in the fourth embodiment, an SiOC film can be formed as in the second embodiment.

Thus, in the fourth embodiment, it is possible to form an SiOC film as well as an SiOCN film.

<Silicon Oxycarbonitride (SiOCN) Film Forming Method>

Figure 10:
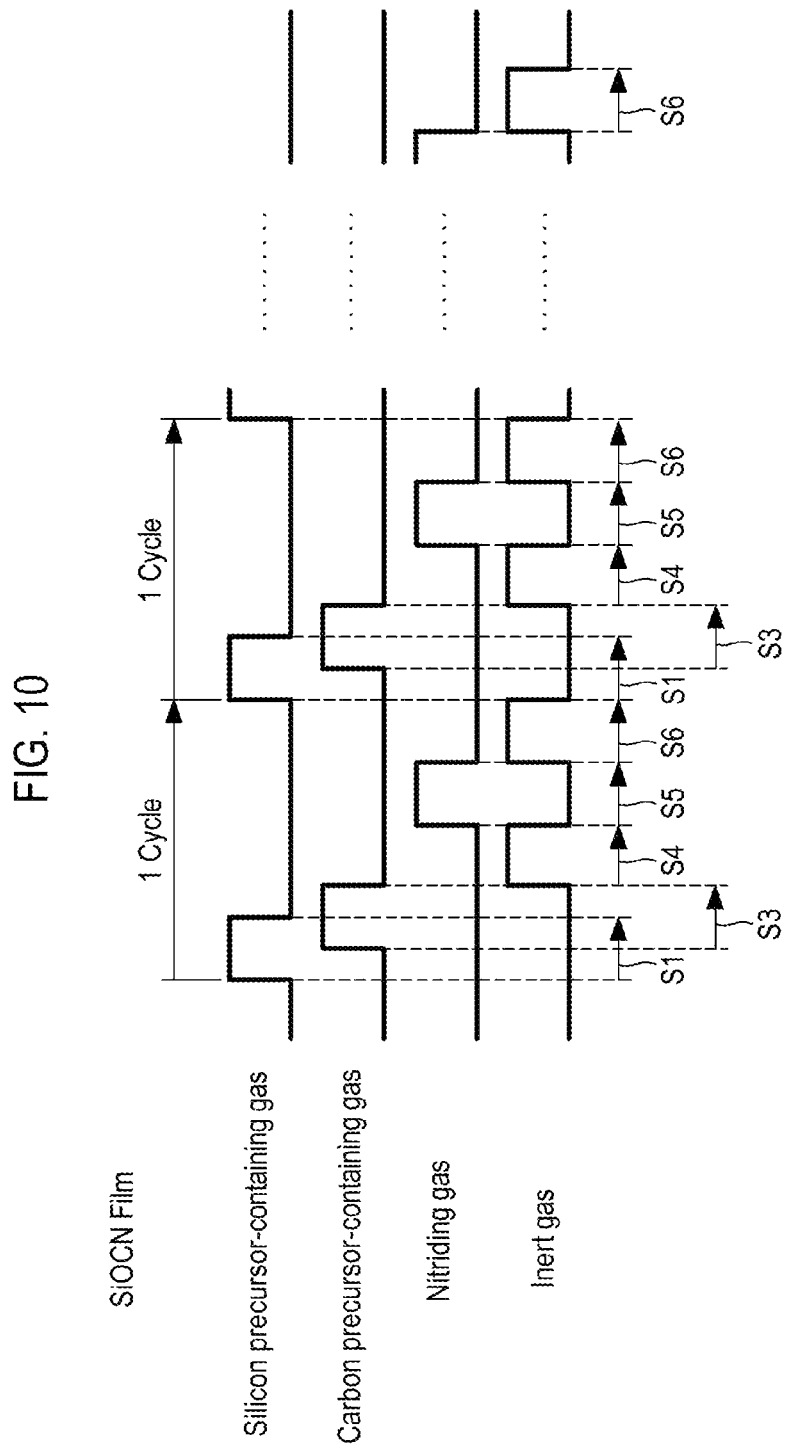
FIG. 10 is a timing diagram representing a second modification of supplying the process gases in the fourth embodiment of the present disclosure.

FIG. 10 is a timing diagram representing a second modification of supplying the process gases in the fourth embodiment of the present disclosure.

As shown in FIG. 10, Steps S1 and S3 may overlap with each other partially not entirely. In this modification, the supply of the silicon precursor having the oxygen-containing group is first initiated and the supply of the carbon precursor is later initiated. After that, the silicon precursor and the carbon precursor are simultaneously supplied and then the supply of the silicon precursor is stopped, whereby only the carbon precursor is supplied. Thereafter, the supply of the carbon precursor is stopped, the purging (Step S4) is performed, and the process proceeds to Step S5 (nitrogen introduction).

In this manner, the fourth embodiment may be modified as the second modification.

<Silicon oxycarbide (SiOC) Film Forming Method>

Figure 11:
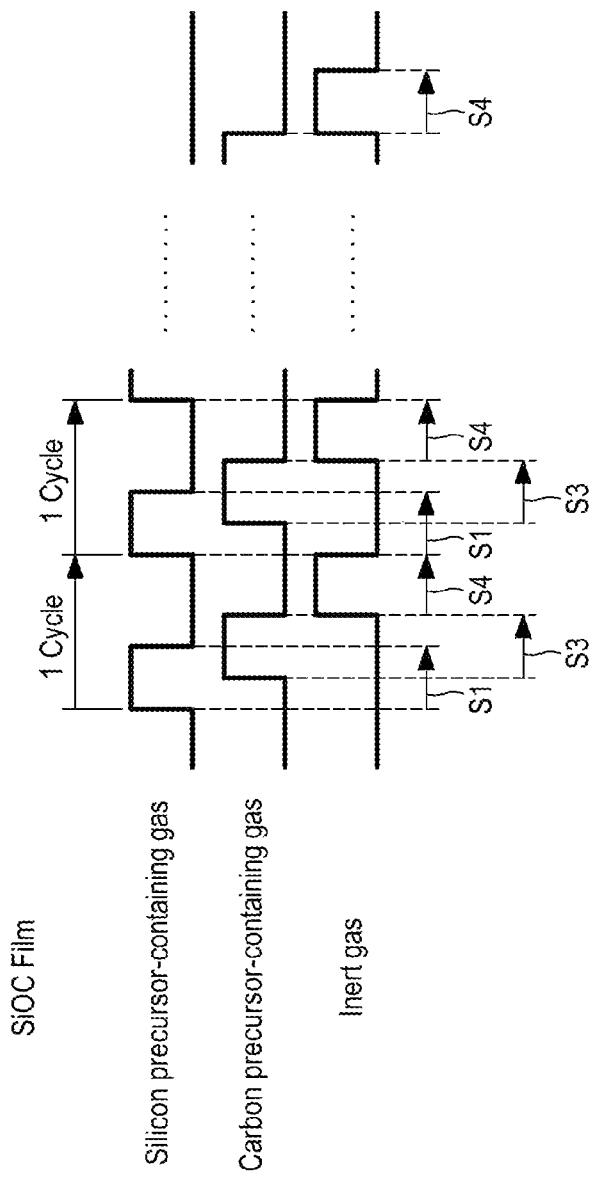
FIG. 11 is a timing diagram representing a third modification of supplying the process gases in the fourth embodiment of the present disclosure.

FIG. 11 is a timing diagram representing a third modification of supplying the process gases in the fourth embodiment of the present disclosure.

As shown in FIG. 11, if Steps S5 and S6 are excluded from the second modification shown in FIG. 10, an SiOC film instead of an SiOCN film can be formed as in the second embodiment.

In this manner, the fourth embodiment may be modified as the third modification.

<Regarding Steps S1 and S3>

Figure 12A:
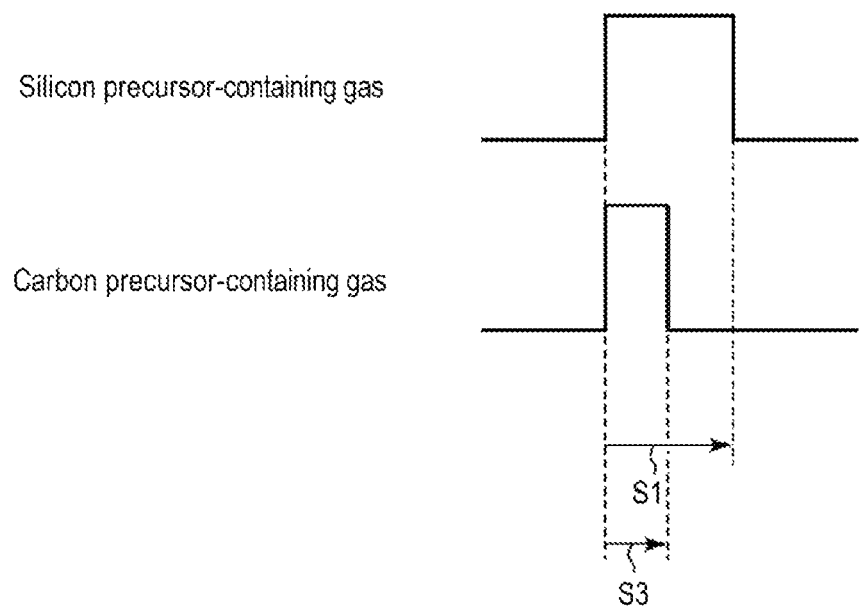
FIG. 12A is a timing diagram representing a fourth modification of supplying the process gases in the fourth embodiment of the present disclosure.

FIG. 12A is a timing diagram representing a fourth modification of supplying the process gases in the fourth embodiment of the present disclosure.

As shown in FIG. 12A, in overlapping Step S3 with S1, for example, it may be possible that the silicon precursor having the oxygen-containing group and the carbon precursor are simultaneously supplied and then the supply of the carbon precursor is stopped earlier than that of the silicon precursor.

Figure 12B:
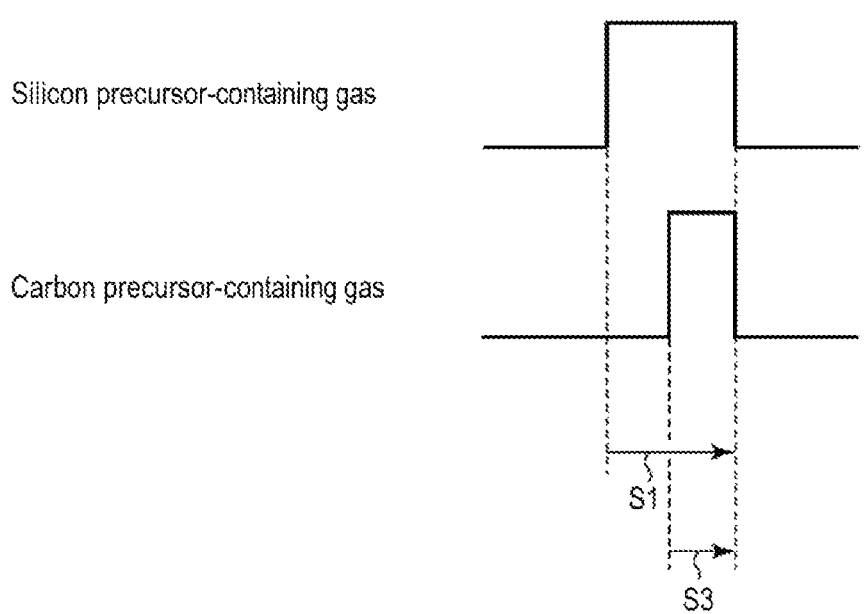
FIG. 12B is a timing diagram representing a fifth modification of supply of the process gas in the fourth embodiment of the present disclosure.

FIG. 12B is a timing diagram representing a fifth modification of supplying the process gases in the fourth embodiment of the present disclosure.

As shown in FIG. 12B, in overlapping of Steps S1 and S3, for example, it may be possible that the silicon precursor having the oxygen-containing group is supplied earlier than that the carbon precursor and then the supply of the carbon precursor is started in the course of the supply of the silicon precursor. In this case, the supplies of silicon precursor and the carbon precursor may be simultaneously stopped.

Figure 12C:
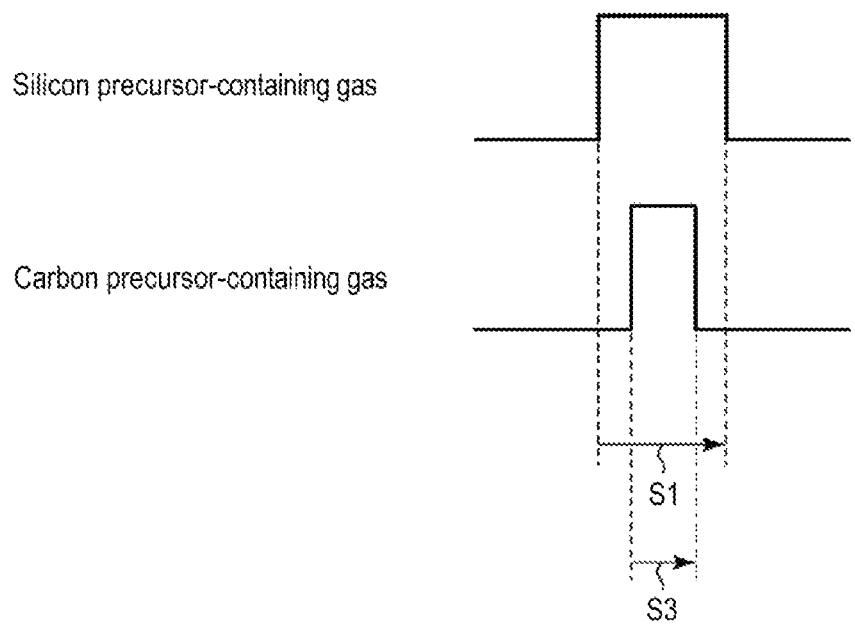
FIG. 12C is a timing diagram representing a sixth modification of supply of the process gases in the fourth embodiment of the present disclosure.

FIG. 12C is a timing diagram representing a sixth modification of supplying the process gases in the fourth embodiment of the present disclosure.

As shown in FIG. 12C, in overlapping Steps S1 and S3, for example, it may possible that the silicon precursor having the oxygen-containing group is supplied earlier than that the carbon precursor and then the supply of the carbon precursor is started in the course of the supply of the silicon precursor. In this case, the supply of the carbon precursor may be stopped earlier than that of the silicon precursor.

Steps S1 and S3 need not overlap with each other entirely. Instead, for example, it is possible to change a time for the supply of the carbon precursor depending on the concentration of carbon to be contained.

<Fifth Embodiment: Film Forming Apparatus>

Next, as a fifth embodiment of the present disclosure, an example of a film forming apparatus capable of performing the method for forming the silicon oxycarbonitride film, the silicon oxycarbide film and the silicon oxynitride film according to the first to fourth embodiments of the present disclosure will be described.

<Flim Forming Apparatus: First Example>

Figure 13:
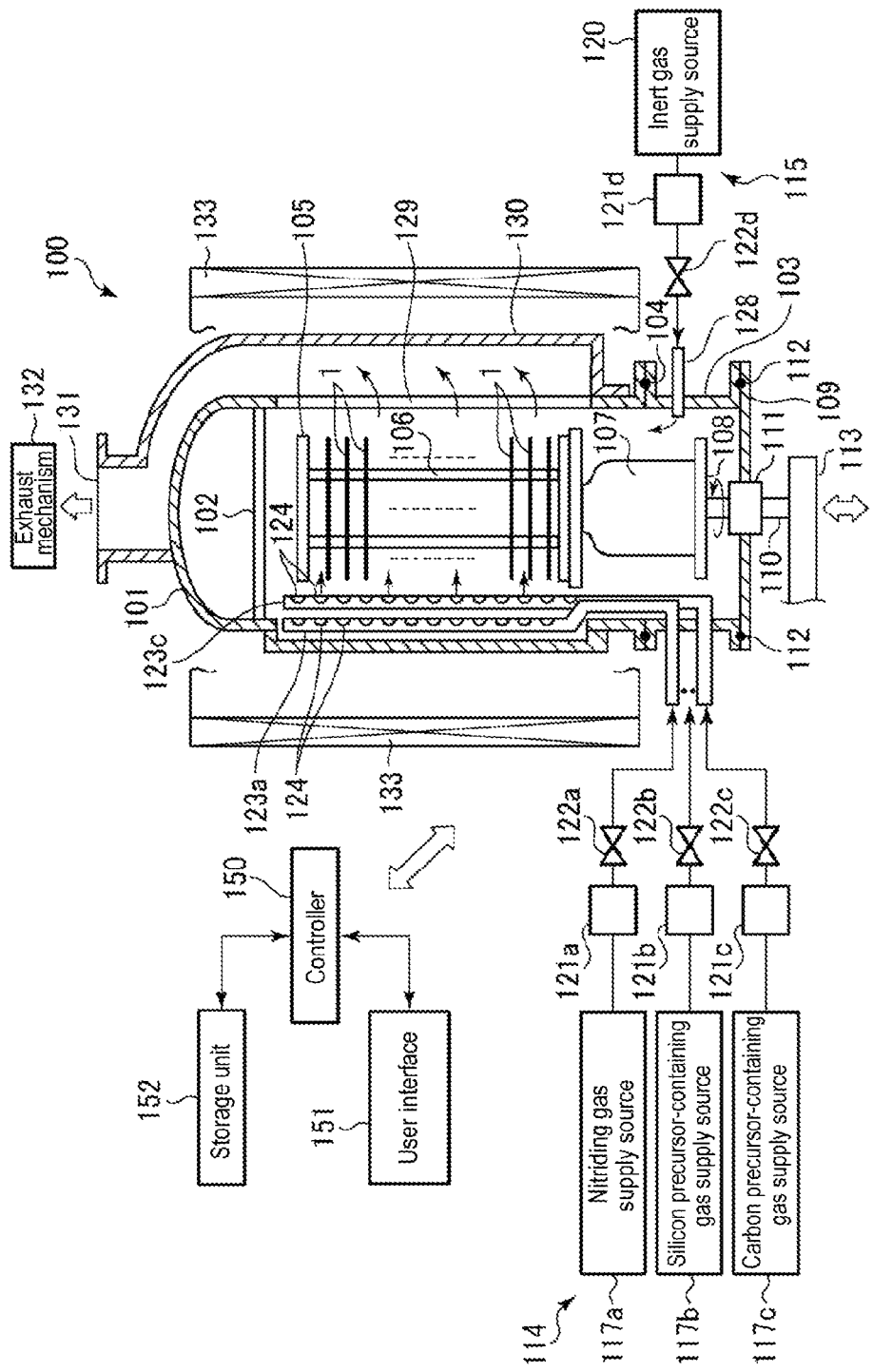
FIG. 13 is a longitudinal sectional view schematically showing a first example of a film forming apparatus according to a fifth embodiment of the present disclosure.

FIG. 13 is a longitudinal sectional view schematically showing a first example of a film forming apparatus according to a fifth embodiment of the present disclosure.

As shown in FIG. 13, a film forming apparatus 100 includes a cylindrical process chamber 101 having an opened bottom and a ceiling. The process chamber 101 is entirely made of, for example, quartz. A ceiling plate 102 made of quartz is installed in the ceiling of the process chamber 101. A cylindrical manifold 103 made of, for example, stainless steel is connected to the opening of the bottom of the process chamber 101 via a seal member 104 such as an O-ring or the like.

The manifold 103 supports the bottom of the process chamber 101. A vertical wafer boat 105 is inserted in the process chamber 101 from below the manifold 103. The vertical wafer boat 105 has a plurality of rods 106, each of which has a plurality of support grooves (not shown) which support portions of the peripheries of a plurality of, e.g., 50 to 100 workpieces (semiconductor wafers 1 in this example). Thus, the semiconductor wafers 1 are placed in multiple stages, i.e., one above another, in the vertical wafer boat 105.

The vertical wafer boat 105 is placed on a table 108 with a heat-insulating tube 107 made of quartz interposed therebetween. The table 108 is supported on a rotary shaft 110 extending through a cover 109 made of, for example, stainless steel which opens/closes an opening of the bottom of the manifold 103. A portion of the rotary shaft 110 extending through the cover 109 is, for example, provided with a magnetic fluid seal 111 to air-tightly seal and rotatably support the rotary shaft 110. A seal member 112 such as an O-ring is interposed between the peripheral portion of the cover 109 and the bottom of the manifold 103. Thus, the process chamber 101 maintains sealability. The rotary shaft 110 is installed in a leading end of an arm 113 supported by an elevation mechanism (not shown) such as a boat elevator or the like. Thus, the vertical wafer boat 105, the cover 109 and the like are integrally elevated and inserted/removed in/from the process chamber 101.

The film forming apparatus 100 includes a process gas supply mechanism 114 for supplying a process gas into the process chamber 101 and an inert gas supply mechanism 115 for supplying an inert gas into the process chamber 101.

The process gas supply mechanism 114 of this example includes a nitriding gas supply source 117a, a silicon precursor-containing gas supply source 117b and a carbon precursor-containing gas supply source 117c.

The inert gas supply mechanism 115 includes an inert gas supply source 120. One example of the nitriding gas is ammonia, one example of the silicon precursor is DEAD-MEOS, one example of the carbon precursor is hexane, and one example of the inert gas is argon.

The nitriding gas supply source 117a is connected to a distribution nozzle 123a via a flow rate controller 121a and an opening/closing valve 122a. Similarly, the silicon precursor-containing gas supply source 117b is connected to a distribution nozzle 123b (not shown in FIG. 13) via a flow rate controller 121b and an opening/closing valve 122b. Similarly, the carbon precursor-containing gas supply source 117c is connected to a distribution nozzle 123c via a flow rate controller 121c and an opening/closing valve 122c.

The distribution nozzles 123a to 123c made of quartz extend inwardly through the side wall of the manifold 103 and extend vertically after being bent upward. A plurality of gas discharge holes 124 is formed at predetermined intervals in vertical portions of the distribution nozzles 123a to 123c. Thus, each of the gases is substantially uniformly discharged into the process chamber 101 through the gas discharge holes 124 in the horizontal direction.

The inert gas supply source 120 is connected to a nozzle 128 via a flow rate controller 121d and an opening/closing valve 122d. The nozzle 128 extends through the side wall of the manifold 103 and discharges the inert gas into the process chamber 101 through its leading end in the horizontal direction.

An exhaust port 129 for exhausting the interior of the process chamber 101 is formed in a portion of the side wall of the process chamber 101 located on the opposite side to the distribution nozzles 123a to 123c. The exhaust port 129 is formed to be elongated by vertically cutting out the side wall of the process chamber 101. An exhaust port cover member 130 having a C-shaped section to cover the exhaust port 129 is provided, by welding, in a portion of the process chamber 101 corresponding to the exhaust port 129. The exhaust port cover member 130 extends upward along the side wall of the process chamber 101 and defines a gas outlet 131 above the process chamber 101. An exhaust mechanism 132 including a vacuum pump or the like is connected to the gas outlet 131. The evacuation of the interior of the process chamber 101 by the exhaust mechanism 132 not only allows the process gases to be expelled after processing, but also regulates the internal pressure of the process chamber 101 to maintain a process pressure required for the processes.

A cylindrical heater 133 is installed in the periphery of the process chamber 101. The heater 133 activates a gas supplied into the process chamber 101 and heats a workpiece (the semiconductor wafer 1 in this example) accommodated in the process chamber 101.

Control of various components of the film forming apparatus 100 is performed by a controller 150 such as a microprocessor (computer). The controller 150 is connected to a user interface 151 including a touch panel to allow a user to input commands for management of the film forming apparatus 100, a display for visualizing and displaying operation status of the film forming apparatus 100 or the like.

The controller 150 is additionally connected to a storage unit 152. The storage unit 152 stores control programs for implementing various processes performed by the film forming apparatus 100 under the control of the controller 150, and programs (i.e., recipes) for causing various components of the film forming apparatus 100 to perform respective processes according to process conditions. The recipes are stored in a storage medium in the storage unit 152. The storage medium may be a hard disk, a semiconductor memory, or a transportable recording medium such as a CD-ROM, DVD, flash memory or the like. In addition, the recipes may be appropriately received from other apparatuses through dedicated lines. If necessary, the recipes are read from the storage unit 152 by instructions from the user interface 151. When the controller 150 executes processes based on the read recipes, the film forming apparatus 100 performs an intended process under control of the controller 150. In this example, processes according to the method for forming the silicon oxycarbonitride film, the silicon oxycarbide film and the silicon oxynitride film according to the first to fourth embodiment are performed under control of the controller 150.

The embodiments of the present disclosure can be carried out by using the film forming apparatus 100 as shown in FIG. 13.

<Film Forming Apparatus: Second Examples>

Figure 14:
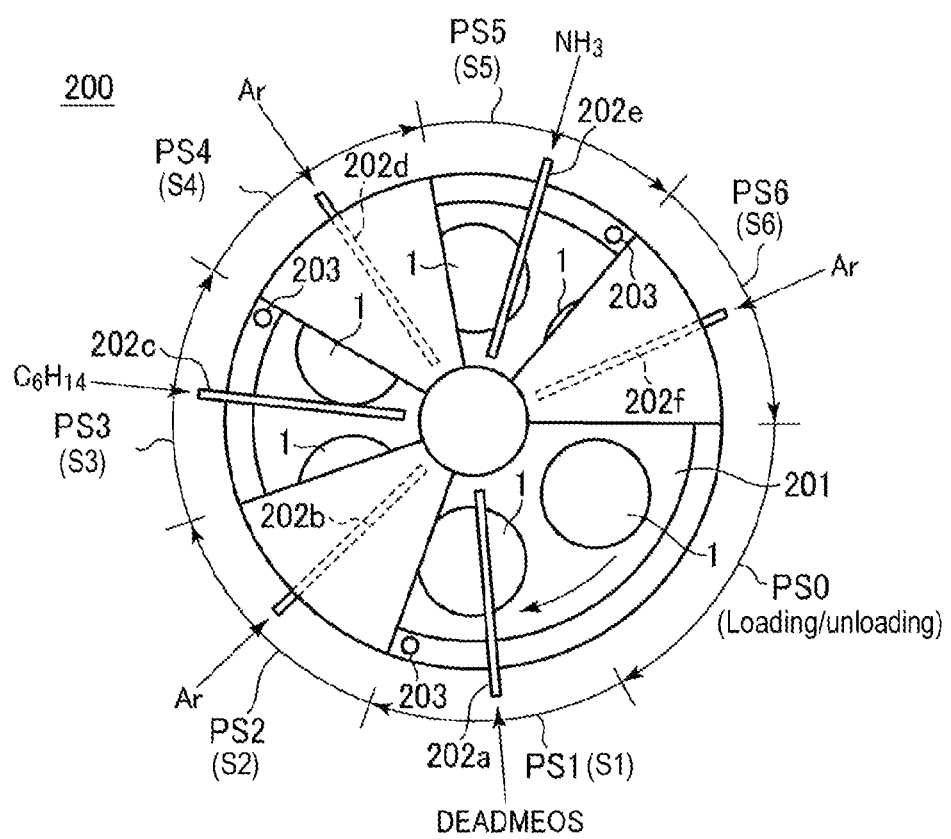
FIG. 14 is a horizontal sectional view schematically showing a second example of the film forming apparatus according to the fifth embodiment of the present disclosure.

FIG. 14 is a horizontal sectional view schematically showing a second example of the film forming apparatus according to the fifth embodiment of the present disclosure.

The film forming apparatus is not limited to a vertical batch type as shown in FIG. 13. For example, the film forming apparatus may be of a horizontal batch type as shown in FIG. 14.

FIG. 14 schematically shows a horizontal section of a process chamber of a horizontal batch type film forming apparatus 200. The film forming apparatus 200 performs a film forming process for a plurality of (e.g., 6) silicon wafers 1 mounted on a turntable 201. The turntable 201 on which the silicon wafers 1 is mounted is rotated, for example clockwise. The process chamber of the film forming apparatus 200 is divided into seven process stages. Through the rotation of the turntable 201, the silicon wafers 1 undergo each of the seven process stages sequentially.

The first process stage PS0 is a loading/unloading stage for loading/unloading the silicon wafer 1 to/out of from the process chamber. The silicon wafers 1 are mounted on the turntable 201 at the first process stage PS0. After the first process stage PS0 is a second process stage PS1.

The second process stage PS1 is a film forming stage for performing Step S1 shown in FIG. 1, i.e., forming an oxygen-containing silicon film. A gas introduction pipe 202a is disposed above the second process stage PS1. The gas introduction pipe 202a supplies a process gas onto the surface of a silicon wafer 1 that has arrived at the second process stage PS1 by the rotation of the turntable 201. In this example, the process gas is a gas containing a silicon precursor having an oxygen-containing group. For example, the process gas is a gas containing a DEADMEOS-containing gas. An exhaust port 203 is formed in the downstream of the second process stage PS1. A next stage to the second process stage PS1 is a third process stage PS2.

The third process stage PS2 is a purging stage for performing Step S2 shown in FIG. 1. The third process stage PS2 has a narrow space through which the silicon wafer 1 passes while being mounted on the turntable. An inert gas is supplied from a process gas introduction pipe 202b into the narrow space. An example of an inert gas includes argon gas. A next stage of the third process stage PS2 is a fourth process stage PS3.

The fourth process stage PS3 is a carbon introducing stage for performing Step S3 shown in FIG. 1. In the fourth process stage PS3, a carbon precursor-containing gas is supplied from a gas introduction pipe 202c onto the process surface of the silicon wafer 1 arrived after its revolving movement by the turntable 201 on which the silicon wafer is mounted. In this example, the carbon precursor is hexane. An exhaust port 203 is formed in the downstream of the fourth process stage PS3. A subsequent process to the fourth process stage PS3 is a fifth process stage PS4.

The fifth process stage PS4 is a purging stage for performing Step S4 shown in FIG. 1. In the fifth process stage PS4, the silicon wafer 1 mounted on the turntable 201 passes through a narrow space into which an inert gas supplied from a process gas introduction pipe 202d flows. A subsequent stage to the fifth process stage PS4 is a sixth process stage PS5.

The sixth process stage PS5 is a nitrogen introducing stage for performing Step S5 shown in FIG. 1. In the sixth process stage PS5, a nitriding gas is supplied from a gas introduction pipe 202e onto the process surface of the silicon wafer 1. An example of the nitriding gas includes an ammonia gas. An exhaust port 203 is formed in the downstream of the sixth process stage PS5. A seventh process stage PS6 is subsequent to the sixth process stage PS5.

The seventh process stage PS6 is a purging stage for performing Step S6 shown in FIG. 1. In the seventh process stage PS6, the silicon wafer 1 mounted on the turntable 201 passes through a narrow space into which an inert gas supplied from a process gas introduction pipe 202f flows. Subsequent to the seventh process stage PS6 is a first process state PS0.

Thus, in the film forming apparatus 200, when the silicon wafer 1 makes one revolution, Steps S1 to S6 shown in FIG. 1 are completed. That is, when the turntable 201 on which the silicon wafers 1 are mounted is turned once, one cycle is completed. When the number of cycles reaches the predetermined number of cycles, the silicon wafer 1 are sequentially unloaded out of the process chamber in the first process stages PS0.

The embodiments of the present disclosure can be carried out by using the film forming apparatus 200 as shown in FIG. 14. In addition, the embodiments of the present disclosure may be carried out by a single wafer type film forming apparatuses as well as the batch type film forming apparatuses.

According to the present disclosure in some embodiments, it is possible to provide a method and apparatus which is capable of forming a silicon oxycarbonitride film, a silicon oxycarbide film and a silicon oxynitride film having a high concentration carbon and/or nitrogen without using oxygen-containing active species.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a silicon oxycarbonitride film, comprising:
    supplying a gas containing a silicon precursor having an oxygen-containing group onto a process surface of a workpiece such that silicon (Si) bonded with oxygen (O) is adsorbed or deposited on the process surface;
    supplying a gas containing a carbon precursor onto the process surface such that some of substituents bonded to Si are substituted with hydrocarbon groups (R); and
    supplying a nitriding gas onto the process surface subjected to the supplying a gas containing a silicon precursor and the supplying a gas containing a carbon precursor such that some of hydrocarbon groups (R) bonded to Si are substituted with amino groups (NH),
    wherein a silicon oxycarbonitride film is formed on the process surface by the supplying the gas containing the silicon precursor, the supplying gas containing the carbon precursor and the supplying a nitriding gas without performing an oxidation process.

2. The method of claim 1, wherein the supplying the gas containing the carbon precursor is performed after the supplying the gas containing the silicon precursor.

3. The method of claim 1, wherein the supplying the gas containing the carbon precursor overlaps with the supplying the gas containing the silicon precursor.

4. The method of claim 1, wherein the oxygen-containing group is an alkoxy group or a carbonyl group.

5. The method of claim 1, wherein the silicon precursor having the oxygen-containing group further includes a substituent that includes at least one of hydrogen, a hydrocarbon group, an amino group and halogen.

6. The method of claim 1, wherein the supplying the gas containing the silicon precursor, the supplying the gas containing the carbon precursor and the supplying the nitriding gas are repeated until a thickness of the silicon oxycarbonitride film reaches a designed value.

7. The method of claim 1, wherein ratios of carbon and nitrogen contained in the silicon oxycarbonitride film are 10% or more, respectively.

* * * * *